United States Patent
Zhu et al.

(10) Patent No.: US 9,559,835 B2
(45) Date of Patent: *Jan. 31, 2017

(54) SIGNAL RECEIVER WITH MULTI-LEVEL SAMPLING

(71) Applicant: MaxLinear, Inc., Carlsbad, CA (US)

(72) Inventors: Jianyu Zhu, San Diego, CA (US); Sheng-Yu Peng, Taiwan (CN); Rodney Chandler, San Diego, CA (US); Pawan Tiwari, Irvine, CA (US); Rahul Bhatia, San Marcos, CA (US); Eric Fogleman, San Marcos, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/563,476

(22) Filed: Dec. 8, 2014

(65) Prior Publication Data

US 2015/0092899 A1     Apr. 2, 2015

Related U.S. Application Data

(63) Continuation of application No. 14/107,212, filed on Dec. 16, 2013, now Pat. No. 8,934,590, which is a
(Continued)

(51) Int. Cl.
| | |
|---|---|
| *H04B 1/10* | (2006.01) |
| *H04L 7/033* | (2006.01) |
| *H03M 1/12* | (2006.01) |

(52) U.S. Cl.
CPC .......... *H04L 7/0334* (2013.01); *H03M 1/1215* (2013.01); *H03M 1/1245* (2013.01)

(58) Field of Classification Search
CPC ........ H03M 1/38; H03M 1/44; H03M 1/0695; H03M 1/16; H03M 1/141; H03M 1/143; H03M 1/161; H03M 1/167
(Continued)

(56) References Cited

U.S. PATENT DOCUMENTS

| | | | |
|---|---|---|---|
| 4,646,258 A | * 2/1987 | Miodownik | ......... H03H 19/002 327/91 |
| 6,608,575 B2 | 8/2003 | Bazarjani | |

(Continued)

FOREIGN PATENT DOCUMENTS

WO      2010053070      5/2010

OTHER PUBLICATIONS

PCT, International Searching Authority, International Search Report and Written Opinion, in Application No. PCT/US12/40738, dated Sep. 21, 2012, 17 pages.

(Continued)

*Primary Examiner* — Lee Nguyen
(74) *Attorney, Agent, or Firm* — McAndrews, Held & Malloy, Ltd.

(57) ABSTRACT

A signal receiver may comprise circuitry for applying multi-level sampling to an input signal, using a plurality of sampling rates that comprises at least two different sampling rates, and circuitry for processing one or more outputs of the multi-level sampling. The processing may comprises sampling at a sampling rate that is different than each of the plurality of sampling rates used during the multi-level sampling and applying analog-to-digital conversion. At least one of the sampling rates used during the multi-level sampling and/or the sampling rate used during the processing may be set based on configuring of one or more clock signals used during the multi-level sampling and/or during the processing. At least one of the one or more clock signals may be configured based on reduction of frequency of a corresponding base clock signal.

20 Claims, 5 Drawing Sheets

Related U.S. Application Data continuation of application No. 13/485,003, filed on May 31, 2012, now Pat. No. 8,611,483.

(60) Provisional application No. 61/493,368, filed on Jun. 3, 2011.

(58) Field of Classification Search
USPC .......................... 375/349; 341/122, 155, 159
See application file for complete search history.

(56) References Cited

U.S. PATENT DOCUMENTS

| 7,015,842 | B1 | 3/2006 | Gupta et al. | |
|---|---|---|---|---|
| 7,496,342 | B2 | 2/2009 | Sorrells et al. | |
| 8,310,387 | B2 | 11/2012 | Harris et al. | |
| 8,350,740 | B2 * | 1/2013 | Akita | G11C 27/024 |
| | | | | 341/122 |
| 8,611,483 | B2 * | 12/2013 | Zhu | H04L 7/0334 |
| | | | | 341/122 |
| 2006/0256845 | A1 * | 11/2006 | Durand | H04B 1/7093 |
| | | | | 375/152 |
| 2009/0045992 | A1 | 2/2009 | Tracht et al. | |
| 2009/0185613 | A1 | 7/2009 | Agazzi et al. | |
| 2009/0222226 | A1 | 9/2009 | Baraniuk et al. | |
| 2009/0245429 | A1 | 10/2009 | Furuta et al. | |
| 2010/0120386 | A1 | 5/2010 | Konstantinos et al. | |
| 2010/0215124 | A1 * | 8/2010 | Zeong | H04B 1/1036 |
| | | | | 375/316 |
| 2010/0316098 | A1 | 12/2010 | Pals et al. | |
| 2011/0128175 | A1 | 6/2011 | Harris et al. | |

OTHER PUBLICATIONS

PCT, Notification Concerning Transmittal of International Preliminary Report on Patentability, in application No. PCT/US2012/040738, dated Dec. 4, 2013, 7 pages.

"A 1-GHz 6-bit ADC System", IEEE Journal of Solid-State Circuits, vol. SC-22, No. 6, Dec. 1, 1987, pp. 962-970.

Extended European Search Report for EP12792638, dated Apr. 14, 2015 (9 pages).

Chinese Office Action in Chinese Patent Application No. 201280036929.0, dated Nov. 25, 2014, including English translation (13 pages).

* cited by examiner

SIGNAL RECEIVER WITH MULTI-LEVEL SAMPLING

CLAIM OF PRIORITY

This application is a continuation/divisional of U.S. patent application Ser. No. 14/107,212, filed on Dec. 16, 2013, which is a continuation of U.S. patent application Ser. No. 13/485,003, filed on May 31, 2012, which in turn makes reference to, claims priority to and claims benefit from U.S. Provisional Application Ser. No. 61/493,368 filed on Jun. 3, 2011.

Each of the above stated applications is hereby incorporated herein by reference in its entirety.

INCORPORATION BY REFERENCE

This application also makes reference to:
U.S. Provisional Patent Application Ser. No. 61/610,550 filed on Mar. 14, 2012;
U.S. Provisional Patent Application Ser. No. 61/433,933 filed on Jan. 18, 2011; and
U.S. patent application Ser. No. 13/351,071 filed on Jan. 16, 2012.

Each of the above stated applications is hereby incorporated herein by reference in its entirety.

FEDERALLY SPONSORED RESEARCH OR DEVELOPMENT

[Not Applicable].

MICROFICHE/COPYRIGHT REFERENCE

[Not Applicable].

FIELD OF THE INVENTION

Certain embodiments of the invention relate to communications. More specifically, certain embodiments of the invention relate to a method and a system for multi-layer time-interleaved analog-to-digital convertor (ADC).

BACKGROUND OF THE INVENTION

Communications typically include transmitting or receiving analog signals over wireless and/or wired connections. The analog signals may be used to carry data (e.g., content), which may be embedded into the analog signals using analog or digital modulation schemes. In this regard, for analog communications, data is transferred using continuously varying analog signals, and for digital communications, the analog signals are used to transfer discrete messages in accordance with a particular digitalization scheme. Therefore, digital communications information requires performing, among other things, digital-to-analog conversion at the transmitting end and analog-to-digital conversion at the receiving end. Such conversions may be complex, may be time consuming, may require considerable power, and/or may introduce errors or distortion.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for multi-layer time-interleaved analog-to-digital convertor (ADC), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for multi-layer time-interleaved analog-to-digital convertor (ADC). In various embodiments of the invention, an electronic device may be configured to a multi-level, time-interleaved sampling and analog-to-digital conversion (ADC) scheme during reception of radio frequency (RF) signals. This may comprise sampling in a first level, at a particular main sampling rate, an input RF signal; sampling in a second level an output of the first level, via a plurality of second-level branches, wherein each of the plurality of second-level branches may sample at a second sampling rate that may be reduced compared to the main sampling rate; and processing in a third level, each output of the plurality of second-level branches via a corresponding one of a plurality of third-level branches. In this regard, each of the plurality of third-level branches comprises a plurality of sub-branches, with each of the plurality of sub-branches being configured to sample at a third sampling rate that is reduced compared to the second sampling rate, and then apply analog-to-digital conversion (ADC).

The first level may also comprise the application of low-noise amplification to the input RF signal, such as prior to the sampling performed therein. The second sampling rate and/or the third sampling rate may be set by configuring clock signals driving the plurality of second-level branches and/or the plurality of third-level branches, based on and/or relative to, for example, a clock signal applied in the first level. In this regard, during the second level, frequency of each clock signal driving the plurality of second-level branches may be reduced relative to a frequency of the clock signal applied in the first level, based on number of the plurality of second-level branches for example. During the third level, for each one of the plurality of third-level branches, the frequency of each clock signal driving each of plurality of sub-branches of that third-level branch may be reduced relative to a frequency of a clock signal driving a corresponding one of the plurality of second-level branches, based on a number of the plurality of sub-branches for example. The output signals of the first level, the plurality of second-level branches, and/or the third-level sub-branches of the plurality of third-level branches may be held during non-read periods as determined based on an applicable sampling rate. The output signals may be held using grounding logic.

Figure 1:
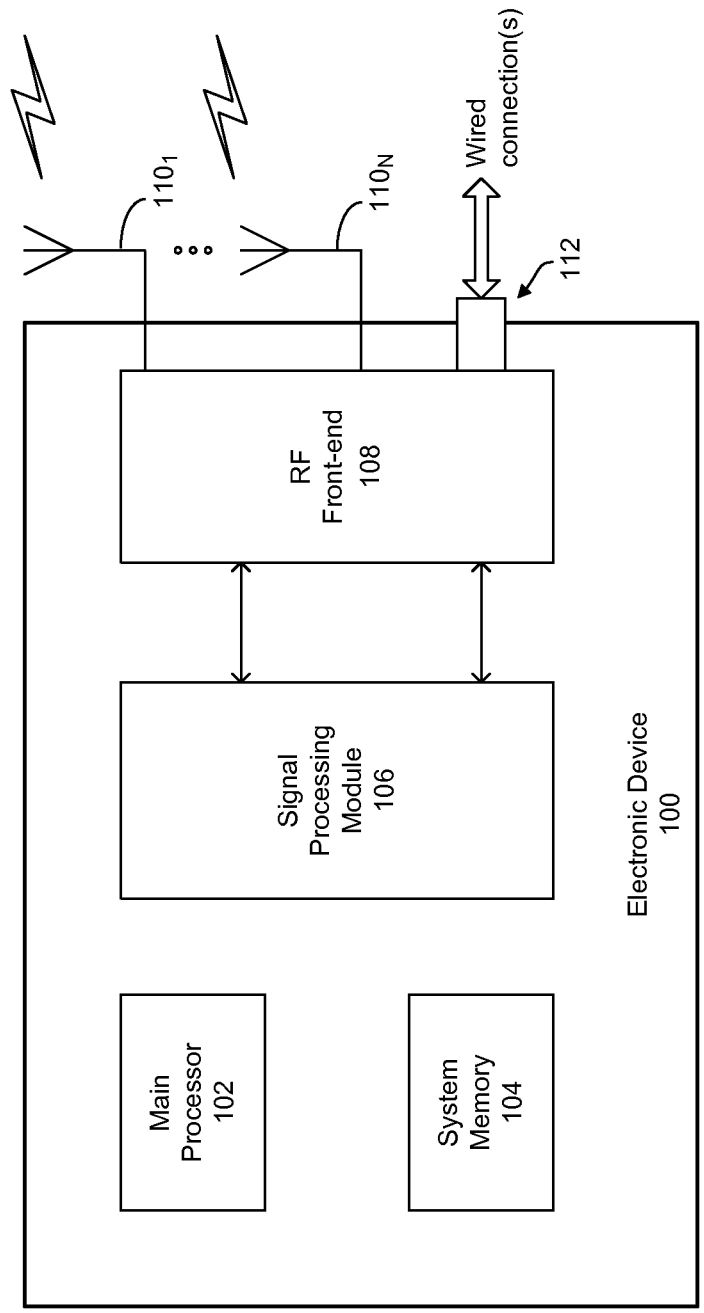
FIG. 1 is a block diagram illustrating an exemplary electronic device, which may be used in accordance with one or more embodiments of the invention.

FIG. 1 is a block diagram illustrating an exemplary electronic device, which may be used in accordance with one or more embodiments of the invention. Referring to FIG. 1 there is shown an electronic device 100.

The electronic device 100 may comprise suitable logic, circuitry, interfaces, and/or code that may be operable to implement various aspects of the invention. In this regard, the electronic device may support communication over wired and/or wireless connections. For example, the electronic device 100 may support a plurality of wired and/or wireless interfaces and/or protocols, and may be operable to perform necessary processing operations to facilitate transmission and/or reception of signals (e.g. RF signals) over supported wired and/or wireless interfaces. Exemplary electronic devices may comprise cellular/smart phones or similar handheld devices, tablets, desktop computers, laptops computers, servers, personal media players, set top boxes or broadband receivers, and/or other like devices. Exemplary wireless protocols or standards that may be supported and/or used by the electronic device 100 may comprise wireless personal area network (WPAN) protocols, such as Bluetooth (IEEE 802.15); wireless local area network (WLAN) protocols, such as WiFi (IEEE 802.11); cellular standards, such as 2G/2G+ (e.g., GSM/GPRS/EDGE) and 3G/3G+ (e.g., CDMA2000, UMTS, HSPA); 4G standards, such as WiMAX (IEEE 802.16) and LTE; Ultra-Wideband (UWB); and/or wireless TV/broadband (access) standards, such as terrestrial and/or satellite TV standards (e.g., DVB-T/T2, DVB-S/S2). Exemplary wired protocols and/or interfaces that may be supported and/or used by the electronic device 100 may comprise Ethernet (IEEE 802.3), Fiber Distributed Data Interface (FDDI), Integrated Services Digital Network (ISDN); and/or wired based TV/broadband (access) standards, such as Digital Subscriber Line (DSL), Data Over Cable Service Interface Specification (DOCSIS), Multimedia over Coax Alliance (MoCA).

The electronic device 100 may comprise, for example, a main processor 102, a system memory 104, a signal processing module 106, a radio frequency (RF) front-end 108, a plurality of antennas $110_1$-$110_N$, and one or more wired connectors 112. The main processor 102 may comprise suitable logic, circuitry, interfaces, and/or code that may be operable to process data, and/or control and/or manage operations of the electronic device 100, and/or tasks and/or applications performed therein. In this regard, the main processor 102 may be operable to configure and/or control operations of various components and/or subsystems of the electronic device 100, by utilizing, for example, one or more control signals. The main processor 102 may enable execution of applications, programs and/or code, which may be stored in the system memory 104, for example. The system memory 104 may comprise suitable logic, circuitry, interfaces, and/or code that may enable permanent and/or non-permanent storage, buffering, and/or fetching of data, code and/or other information, which may be used, consumed, and/or processed in the electronic device 100. In this regard, the system memory 104 may comprise different memory technologies, including, for example, read-only memory (ROM), random access memory (RAM), Flash memory, solid-state drive (SSD), and/or field-programmable gate array (FPGA). The system memory 104 may store, for example, configuration data, which may comprise parameters and/or code, comprising software and/or firmware.

The signal processing module 106 may comprise suitable logic, circuitry, interfaces, and/or code for enabling processing of signals transmitted and/or received by the electronic device 100. The signal processing module 106 may be operable to perform such signal processing operation as filtering, amplification, up-convert/down-convert baseband signals, analog-to-digital and/or digital-to-analog conversion, encoding/decoding, encryption/decryption, and/or modulation/demodulation.

The RF front-end 108 may comprise suitable logic, circuitry, interfaces, and/or code that may be operable to perform RF transmission and/or reception during wireless and/or wired communications, such over a plurality of supported RF bands and/or carriers. The RF front-end subsystem 108 may be operable to perform, for example, wireless communications of RF signals via the plurality of antennas $110_1$-$110_N$. Each of the plurality of antennas $110_1$-$110_N$ may comprise suitable logic, circuitry, interfaces, and/or code that may enable transmission and/or reception of RF signals within certain bandwidths and/or based on certain protocols. The RF front-end subsystem 108 may be operable to perform wired communications of RF signals via the plurality of connectors 112. The wired connectors 112 may comprise suitable logic, circuitry, interfaces, and/or code that may enable transmission and/or reception of RF signals over wired connections, within certain bandwidths and/or based on certain protocols (e.g. MoCA).

In operation, the electronic device 100 may be operable to perform wired and/or wireless communication, in accordance with one or more interfaces and/or protocols supported thereby. In this regard, the electronic device 100 may be operable to transmit and/or receive RF signals over supported wired and/or wireless interfaces, using the RF front-end 108, and to perform necessary signal processing operations to facilitate such transmission/reception, using the signal processing module 106. The RF signals transmitted and/or received by the electronic device 100 may carry data pertaining to applications running in the electronic device 100. The RF signals communicated to/from the electronic device 100 may comprise analog signals, in which the communicated data may be embedded using analog or digital modulation schemes. In this regard, during analog communications, data may be transferred used continuously varying analog signals, and during digital communications, the analog signals are used to transfer discrete messages in accordance with particular digitalization scheme. Accordingly, during performance of digital communications, the signal processing operations performed by the electronic device 100 may comprise, among other things, digital-to-analog conversion on the transmitting side and analog-to-digital conversion on the receiving side. Such conversions may be complex, may be time consuming, may require considerable power, and/or may introduce errors or distortions, especially when very wideband signals are communicated.

In various embodiments of the invention, an enhanced architecture may be utilized to improve performance during certain signal processing operations, such as with respect to sampling and analog-to-digital conversions performed during RF reception. For example, a multi-layer, time-interleaved architecture may be used during RF reception, particularly for sampling and analog-to-digital conversions performed during such RF reception. In this regard, with interleaved sampling and analog-to-digital conversion, a signal (typically very wideband) may be received and digitized by using multiple smaller sub-ADCs (analog-to-digital convertors) with sampling being done at lower frequencies, and with the sub-ADCs taking turns to sample the input signal. In the multi-layer, time-interleaved architecture implemented in accordance with aspects of the present invention, the sampling and/or digitizing may be further enhanced by reducing or eliminating clocking/sampling mismatch errors, and/or by reducing power or resource requirements for performing the analog-to-digital conversions. For example, the sampling and analog-to-digital conversions may be performed in multiple layers (stages), thus enabling the division of the sampling and/or analog-to-digital conversions into a plurality of parallel interleaved paths, with these stages and/or parallel paths being time-interleaved—i.e., using inter-related clocking scheme. In this regard, the different layers of the multi-layer, time-interleaved architecture may be clocked using predetermined clock phases derived from, and relating to a single clock, to synchronize the various operations performed by the different layers, or components thereof.

In one representative embodiment of the invention, a single-chip may be implemented, which may provide direct RF reception function(s)—including required sampling and analog-to-digital conversions—in a singular multi-layer, time-interleaved front-end architecture. Such single-chip receiver architecture may enable integration of the entire receiving path, including the RF front-end (e.g., the RF front-end 108), baseband and digital signal processing (i.e., at least some of the functions of the signal processing module 106) onto a single chip, which results in enhanced performance (higher bandwidth and/or lower latency, and/or better signal integrity) and lower power consumption. This is described in more detail with respect to FIG. 2, for example.

Figure 2:
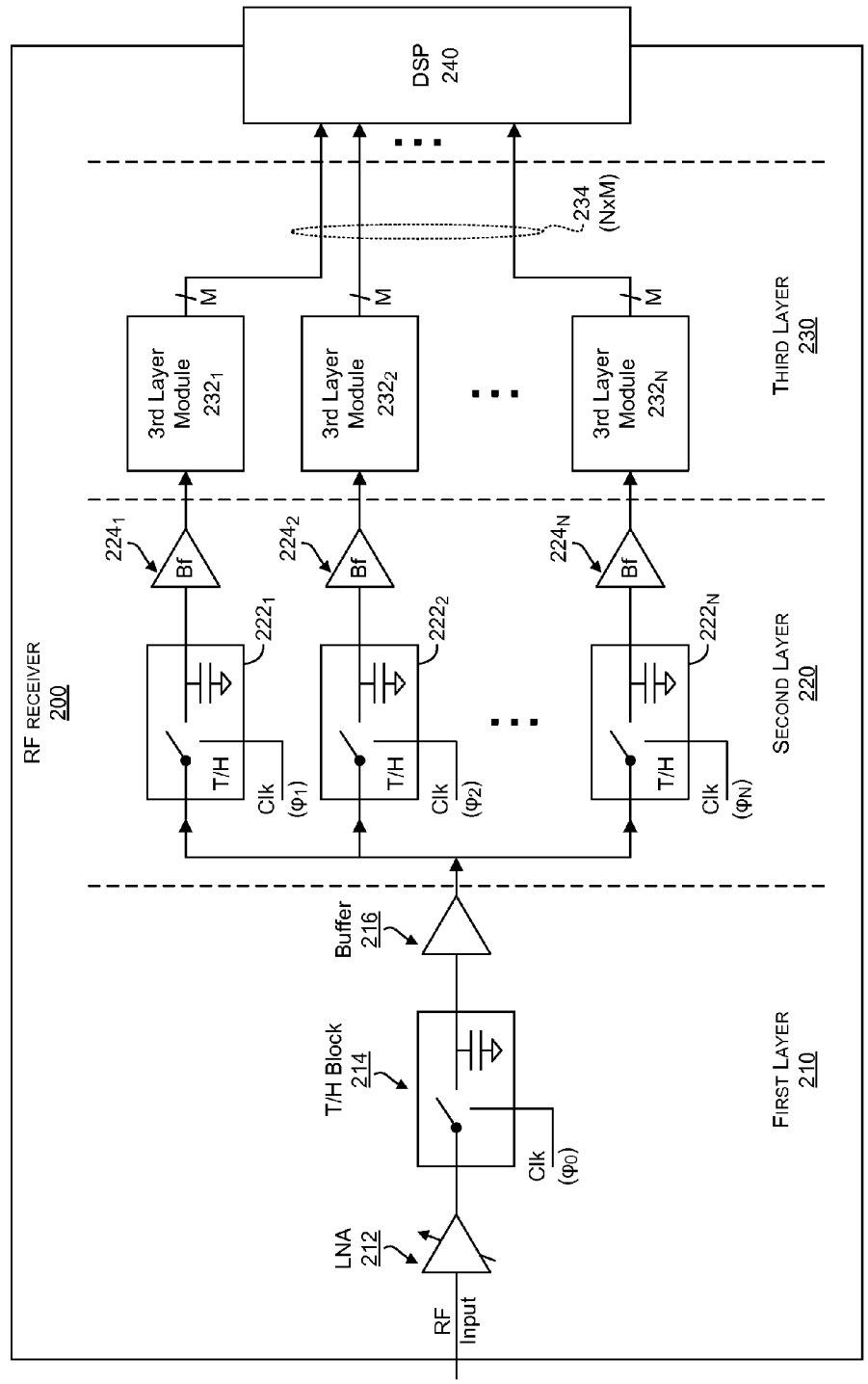
FIG. 2 is a block diagram illustrating an exemplary multi-layer time-interleaved analog-to-signal convertor (ADC), in accordance with a representative embodiment of the invention.

FIG. 2 is a block diagram illustrating an exemplary multi-layer time-interleaved analog-to-signal convertor (ADC), in accordance with a representative embodiment of the invention. Referring to FIG. 2, there is shown a RF receiver 200.

The RF receiver 200 may comprise suitable logic, circuitry, code, and/or interfaces operable to perform RF reception and/or processing operations related thereto. In this regard, the RF receiver 200 may incorporate a single-chip receiver architecture, in which the entire receiving path may be integrated onto a single chip which may directly provide various RF reception related function(s) comprising, e.g., receiving RF (analog) signals (e.g., via antennas or wired-based connectors), amplification, sampling and analog-to-digital conversions (if needed), and at least some of the required signal processing (e.g., baseband/passband processing and/or digital signal processing).

In a representative embodiment of the invention, the RF receiver 200 may be configured to provide sampling and analog-to-digital conversions in a singular multi-layer, time-interleaved manner. For example, the RF receiver 200 may provide analog-to-digital conversion (ADC). In this regard, when the received (analog) signals comprise digitally modulated communication, the RF receiver 200 may be operable to perform analog-to-digital conversions, to enable the generation of digital signals based on sampling of the analog signals, in which a sequence of samples—that is sequence of discrete-time information—may be determined and/or generated based on the received analog signals. The signal sampling may be achieved by reading the value of continuous input analog signals at certain, periodic intervals as determined by an applicable sampling rate for example. In an aspect of the invention, the RF receiver 200 may be implemented or configured as multi-layer, time-interleaved module. In this regard, the RF receiver 200 may be configured to perform, for example, the sampling and analog-to-digital conversion in a plurality of layers (stages), such as a first layer 210, a second stage 220, and a third stage 230.

The first stage 210 may comprise a low noise amplifier (LNA) 212, a first (1st) stage track-and-hold (T/H) block 214, and a buffer 216. The LNA 212 may comprise suitable logic, circuitry, code, and/or interfaces operable to amplifying weak RF signals, such as RF signals received wirelessly via antenna(s) or over wired connections, to reduce and/or prevent noise during reception of the RF signals.

The 1st stage T/H block 214 may comprise suitable logic, circuitry, code, and/or interfaces operable to directly sample a signal inputted into the T/H 214, at a particular sampling rate. In this regard, the 1st stage T/H block 214 may be configured to sample an analog (continuous) input signal by reading it only at particular, periodic intervals, as determined based on the sampling rate for example, while blocking passage of the input signal otherwise. In this regard, the 1st stage T/H block 214 may utilize a switching logic to switch off passing of the input signal between the read points, and track and hold the output constant, such as by using ground logic, when the input signal is switched off. The operation of the 1st stage T/H block 214 may be controlled to switch off passing the input signal based on clock signal, such as by switching on passing the input signal (and sampling it) only when the clock signal is asserted. For example, when the clock signal is asserted, the input and output ports may be connected (via the switching logic), and the input signal may be tracked. On the other hand, when the clock is deasserted, the input signal may be sampled and held. In this regard, passing the input signal through the 1st stage T/H block 214 may be switched off, and the output signal may be tracked and held at a particular, predetermined value—e.g., by using the ground logic to set the output of the 1st stage T/H block 214 to logic '0'.

The buffer 216 may comprise suitable logic, circuitry, code, and/or interfaces operable to buffer and transfer signals from a component/circuit coupled to its input port to component(s)/circuit(s) coupled to its output port. The use of the buffer 214 may also allow blocking undesired effects (e.g., loading), to the input connected components, by the output connected components. The buffer 216 may be a unity-gain buffer—that is having no gain, and such signals transferred buffer 216 are transferred unchanged.

The second stage 220 may comprise a plurality of branches (e.g., N branches, with 'N' being a non-zero natural number). Each branch may comprise a second (2nd) stage track-and-hold (T/H) block $222_x$ and a 2nd stage buffer $224_x$ (with x taking values between 1 and N). Each 2nd stage T/H block $222_x$ may be substantially similar to the 1st stage T/H block 214; and each 2nd stage buffer $224_x$ may be substantially similar to the buffer 216. The clock signals used for each of the 2nd stage T/H blocks $222_1$-$222_N$ may be, however, different. In this regard, the clock signals of the 2nd stage T/H blocks $222_1$-$222_N$ may be configured in accordance with a particular clock shifting scheme that ensures proper function of the multi-layer, time-interleaved operation of the RF receiver 200. This is described in more detail below.

The third stage 230 may comprise a plurality of third (3rd) layer modules $232_1$-$232_N$. In this regard, each of the branches of the second stage 220 may be coupled (e.g., via corresponding 2nd stage buffer $224_x$) to a corresponding one of the 3rd layer modules $232_1$-$232_N$. Each 3rd layer module $232_x$ may comprise suitable logic, circuitry, code, and/or interfaces operable to perform sampling and analog-to-digital conversion. In an embodiment of the invention, each of the 3rd layer modules $232_1$-$232_N$ may comprise a plurality of sub-ADC (analog-to-digital convertor) modules, for enabling setting up and using, in parallel for example, multiple sampling and digitization paths. For example, each 3rd layer module $232_x$ may comprise M sub-ADCs, with M being a non-zero natural number). Accordingly, the RF receiver 200 may comprise N×M sub-ADC modules (and thus N×M distinct and parallel sampling/digitizing paths).

The RF receiver 200 may also incorporate at least a portion of a digital signal processing (DSP) 240, to support the single-chip receiver architecture. In this regard, the DSP block 240 may comprise suitable logic, circuitry, code, and/or interfaces operable to perform computationally intensive processing of data during communication operations. The DSP block 240 may be operable to, for example, encode, decode, modulate, demodulate, encrypt, decrypt, scramble, descramble, and/or otherwise process data that may be carried in transmitted or received signals. The DSP block 240 may be configured to select, apply, and/or adjust a modulation scheme, error coding scheme, and/or data rates based on type and/or characteristics of interface being used in communicating the signals (carrying the data).

In operation, the RF receiver 200 may be configured to utilize a multi-layer, interleaved scheme for performing sampling and analog-to-digital conversion (ADC) during reception of RF signals. For example, after a RF signal is received (e.g., via antennas $110_1$-$110_N$ or wired connection 112), the RF signal may be processed via a first layer 210, a second layer 220, and a third layer 230. Furthermore, in some implementations (e.g., when the RF receiver 200 is implemented as full RF path on single chip), the RF receiver 200 may also be operable to perform at least some digital processing subsequent to the completion of sampling and ADC processing. In this regard, during the first layer 210, after the RF input signal is first received, and gained up by the LNA 212, the output of the LNA 212 may then be directly sampled via the 1st stage T/H block 214, which may be configured to apply a particular sampling rate (e.g., $F_S$). The sampled signal may then be buffered, using buffer 216 (which may be, e.g., a unity-gain buffer), which may be used to control passing of the output of the first layer 210 onto the next layer—that is the second layer 220.

Processing during the second layer 220 may comprise sampling via the 2nd stage T/H blocks $222_1$-$222_N$. In this regard, the 2nd stage T/H blocks $222_1$-$222_N$ may take turns in resampling the signal buffered via the buffer 216. In this regard, in accordance with the multi-layer, time interleaved implementation, each of the 2nd stage T/H blocks $222_1$-$222_N$ may be configured to sample at a reduced rate. The 2nd stage T/H blocks $222_1$-$222_N$ may be configured to sample at the rate $F_S/N$. In this regard, the sampling rate applied in the second layer 220 may be selected and/or configured such that the number of samples generated via the 2nd stage T/H blocks $222_1$-$222_N$ during any time interval may match the number of samples obtained via the first layer 210—e.g., for each cycle of sampling via the second layer 220 (through all N 2nd stage T/H blocks $222_x$), there would be N samples read via the 1st stage T/H block 214. Furthermore, each of the 2nd stage T/H blocks $222_1$-$222_N$ may be configured to hold their outputs at a particular predetermined value (e.g., logic '0' using a grounding logic) in between sampling reads. The output of each 2nd stage T/H block $222_x$ may be buffered, again, via corresponding 2nd stage buffer $224_x$, which may be used to control passing of the outputs (N) of the second layer 220 onto the next layer—that is the third layer 230.

Processing during the third layer 230 may comprise performing a third stage sampling followed by analog-to-digital sampling via each of the 3rd layer modules $232_1$-$232_N$. In this regard, each of the 3rd layer modules $232_1$-$232_N$ may further incorporate use of plurality of branches (e.g., M), each of which is operable to perform sampling (via T/H block) and analog-to-digital conversion via a sub-ADC module. This shown in more detail in FIG. 3. Accordingly, at the end of the third layer 230, a total of N×M digital codes may be obtained from all the time-interleaved sub-ADC modules, which (the digital outputs) may then be recombined into a total digital output that may be run at the full sampling rate $F_S$. The total digital output may be finally filtered and/or decoded by the DSP block 240, to extract desired signals (or data carried thereby).

Figure 3:
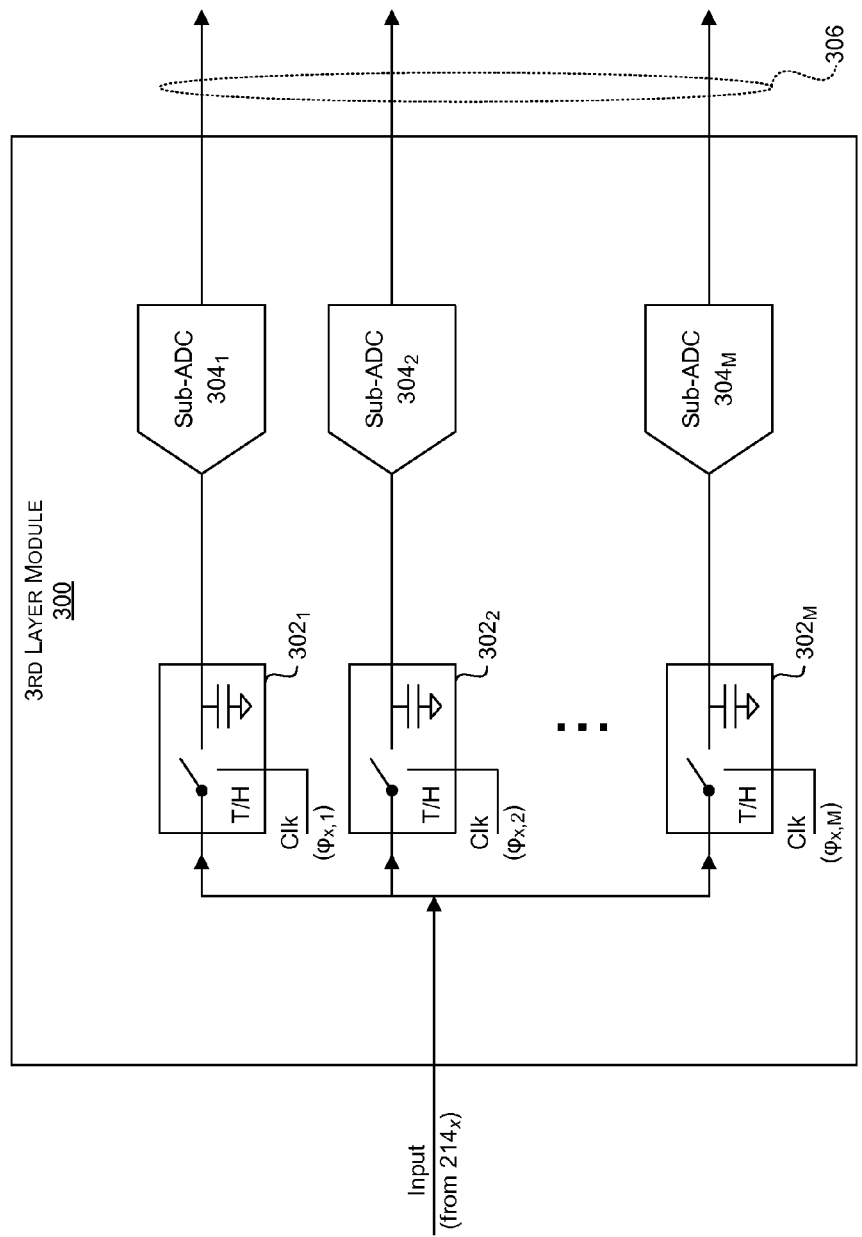
FIG. 3 is a block diagram illustrating an exemplary third layer module for use in a multi-layer time-interleaved analog-to-signal convertor (ADC), in accordance with a representative embodiment of the invention.

FIG. 3 is a block diagram illustrating an exemplary third layer module for use in a multi-layer time-interleaved analog-to-signal convertor (ADC), in accordance with a representative embodiment of the invention. Referring to FIG. 3, there is as shown a 3rd layer module 300, which may correspond to each of the 3rd layer modules $232_1$-$232_N$ of FIG. 2, for example.

The 3rd layer module 300 may comprise a plurality of branches (e.g., M branches, with 'M' being a non-zero natural number). Each branch may comprise a third (3rd) stage track-and-hold (T/H) block $302_y$ and a sub-ADC module $304_y$ (with 'y' taking values between 1 and M). Each 3rd stage T/H block $302_y$ may be substantially similar to the 1st stage T/H block 214 of FIG. 2, for example. The clock signals used for each of the 3rd stage T/H blocks $302_1$-$302_M$ may be, however, different. In this regard, the clock signals of the 3rd stage T/H blocks $302_1$-$302_M$ may be configured in accordance with clock shifting scheme implemented in the RF receiver 200, whereby each of the 1st stage T/H block 214, the 2nd stage T/H blocks $222_1$-$222_N$, and the 3rd stage T/H blocks $302_1$-$302_M$ may have assigned unique clock signal, based on corresponding particular clock shift.

Each sub-ADC module $304_y$ may comprise suitable logic, circuitry, code, and/or interfaces operable to analog samples (as received from corresponding 3rd stage T/H block $302_y$) to corresponding digital codes. The sub-ADC module $304_y$ may perform the conversion in accordance with a particular rate, which may be determined and/or configured based on a clocking scheme implemented in the RF receiver 200.

In operation, the 3rd layer module 300 may be used during multi-layer, time-interleaved sampling and ADC scheme during RF reception, such as via the RF receiver 200. For example, a plurality of 3rd layer modules 300 may be used during third layer 230 processing (e.g., corresponding to the 3rd layer modules $232_1$-$232_N$). In this regard, the 3rd stage T/H blocks $302_1$-$302_M$ of the 3rd layer modules $232_1$-$232_N$ (i.e., N×M 3rd stage T/H blocks) may take turns in resampling outputs of the 2nd stage branches, which may be buffered in 2nd stage buffers $224_1$-$224_N$, at further reduced rate (e.g., $F_S/N/M$). In this regard, the sampling rate applied in the third layer 230 may be selected and/or configured such that the number of samples generated of via the 3rd stage T/H blocks (e.g., all N×M of them) during any time interval may match the number of samples obtained via each of the first layer 210 and the second layer 220 within the time interval—e.g., during a time interval corresponding to a full cycle of all the 3rd stage T/H blocks (e.g., all N×M of them), there might be M samples read via each of the N second layer branches (for a total of N×M samples), and N×M samples read via the 1st stage T/H block 214. As with the other T/H blocks, each of the 3rd stage T/H blocks 302$_y$ may be configured to hold their outputs at a particular predetermined value (e.g., logic '0' using a grounding logic) in between sampling reads. The sampled output of each 3rd stage T/H block 302$_y$ may be passed onto corresponding sub-ADC module 304$_y$, which may convert the analog samples to digital codes. Each 3rd stage T/H block 302$_y$ may have roughly $(N-1)/F_S$ time to fully settle to the desired input signal. Each sub-ADC module 304$_y$ may have roughly $(NM-N-1)/F_S$ time to process the analog sample.

The use of direct sampling of RF signals from the LNA may remove the need for using particular components, such as mixers and tunable frequency synthesizers, which may otherwise be required thus saving power and area and simplifying system design. A front-end architecture, in accordance with aspects of the present invention, may allow time-interleaving a large number of sub-ADC modules which may run at relatively low speed and low power to form a very high-speed ADC that is capable of running at high (>GHz) sample rate and suitable for RF sampling. Compared with architectures that time-interleave multiple T/H stages at the front, the described architecture may allow employing a single T/H stage initially, which may enable avoiding errors arising from sample time mismatches and bandwidth mismatches between the time interleaved T/H stages. Compared with architectures that time-interleave a large number of sub-ADC modules in one flat layer, the described architecture, in accordance with aspects of the present invention, may employ a multi-layer time-interleaving structure that reduces the number of T/H stages or sub-ADC modules in each layer that the unity-gain buffer needs to drive, hence relaxing the otherwise-very-stringent design requirements (e.g. speed and power) for the buffer. The multi-layer time-interleaving structure may also increase the available settling time for the T/H stages in the third layer, hence relaxing the design requirement for the T/H circuits, because the second layer T/H already samples the input at a much lower rate (e.g., $F_S/N$), so each T/H stage in the third layer may receive a signal that only changes at the rate of $F_S/N$.

Figure 4:
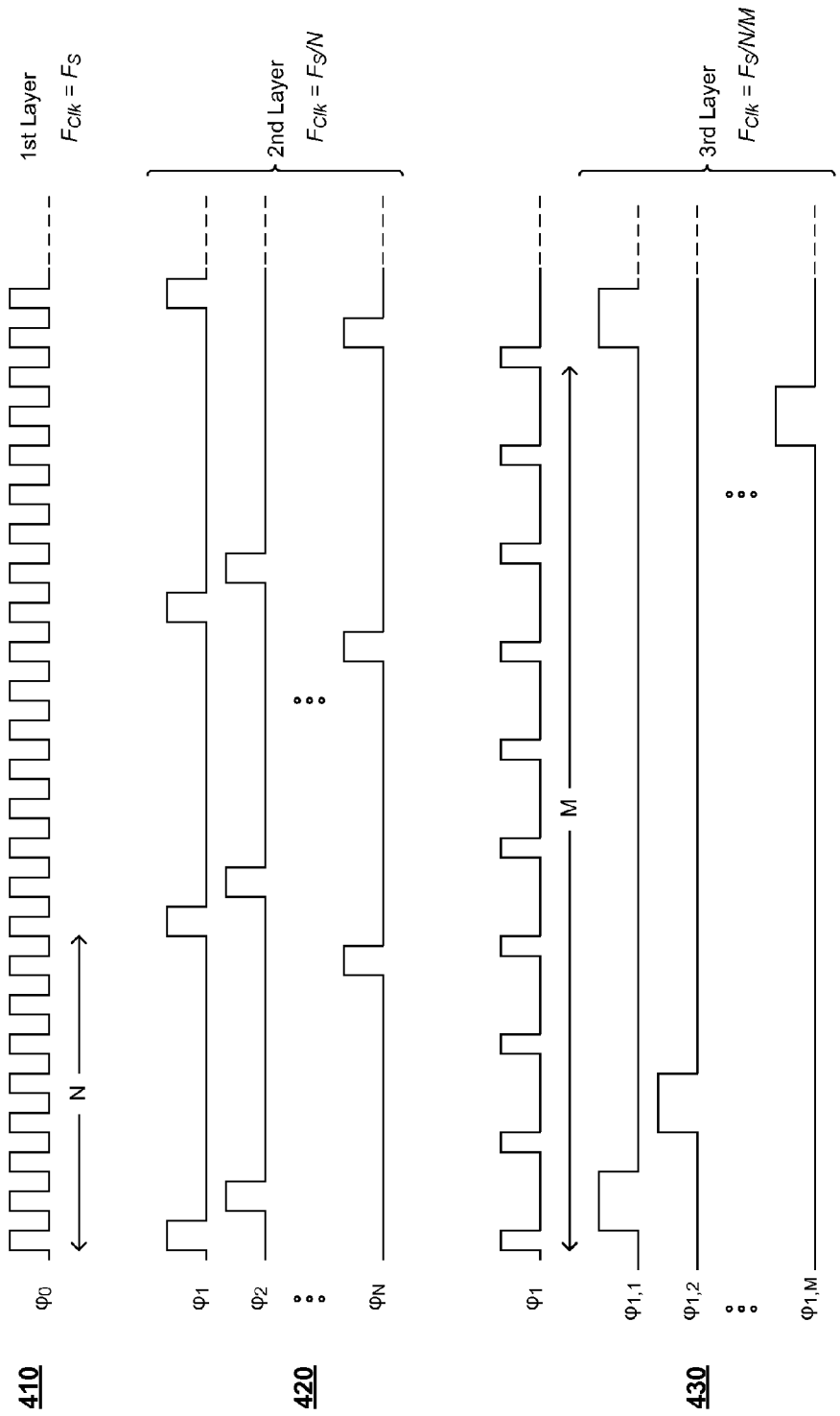
FIG. 4 is a timing diagram illustrating an exemplary clocking for use in multi-layer time-interleaved signal processing, such as during ADC operations, in accordance with a representative embodiment of the invention.

FIG. 4 is a timing diagram illustrating an exemplary clocking for use in multi-layer time-interleaved signal processing, such as during ADC operations, in accordance with a representative embodiment of the invention. Referring to FIG. 4, there are shown timing diagrams 410, 420, and 430, corresponding to clock signal timing and/or shifting for three different layers in a multi-layer, time-interleaved sampling and analog-to-digital conversion (ADC) operation.

The timing diagram 410 shows clock timing for a first layer, such as for the first layer 210 of the RF receiver 200. In this regard, the clock signal applicable to, for example, the 1st stage T/H block 214 of the first layer 210 (i.e., clock signal $Clk_{\phi 0}$) may be configured to have an assertion rate $F_{Clk}$ (i.e., frequency of asserting the clock signal) which may be equal to the sampling rate $F_S$. In other words, the clocking signal of the 1st stage T/H block 214 of the first layer 210 may be configured such that the 1st stage T/H block 214 may sample the input signal at exactly the sampling rate $F_S$.

The timing diagram 420 shows clock timing for a second layer, such as for the second layer 220 of the RF receiver 200. In this regard, the clock signals for each of the N branches of the second layer 220 (i.e., clock signal $Clk_{\phi 1}$-$Clk_{\phi N}$) may be set at reduced assertion rate $F_{Clk}$, which may be set to $F_S/N$ for example, and with each clock signal being shifted such that the corresponding component (i.e., 2nd stage T/H block 222$_x$) would be the only block switched on and (re)sampling at any given point. In other words, the clocking signals for the second layer 220 of the RF receiver 200 are configured such that within every N-samples sequence performed by the 1st stage T/H block 214 of the first layer 210, each of the N 2nd stage T/H block 222$_x$ of the second layer 220 would perform a single resampling of the input signal.

The timing diagram 430 shows clock timing for a third layer, such as for the third layer 230 of the RF receiver 200. In this regard, the clock signals for each of the 3rd layer modules (e.g., 232$_1$-232$_N$) may be set up based on the corresponding branch of the second layer 220—e.g., synchronized to assertions of the clock of the corresponding 2nd layer branch, and be configured to allow resampling the input signal through all of the branches of the 3rd layer module between two successive assertions of the of the clock of the corresponding 2nd layer branch. For example, timing diagram 430 shows the clocking timing for the 3rd layer module 232$_1$, which may be coupled (via corresponding 2nd stage buffer 224$_1$) to 2nd stage T/H block 222$_1$. In this regard, the clock signals for each of the M branches of the 3rd layer module 232$_1$ (i.e., clock signal $Clk_{\phi 1,1}$-$Clk_{\phi 1,M}$) may be set at further reduced assertion rate $F_{Clk}$, which may be set to $F_S/N/M$ for example, and with each clock signal being shifted such that the corresponding component (i.e., 3rd stage T/H block 302$_y$) would be the only block switched on and (re)sampling at any given point. In other words, the clocking signals for the 3rd layer module 232$_1$ may be configured such that within every M-samples sequence performed by the corresponding 2nd stage T/H block 222$_1$ of the second layer 220, each of the M 3rd stage T/H blocks 302$_y$ of the 3rd layer module 232$_1$ would perform a single resampling of the input signal.

Accordingly, the clocking of the RF receiver 200 may be configured such that for each N×M consecutive samples performed by the 1st stage T/H block 214 of the first layer 210, each of the N 2nd stage T/H blocks 222$_x$ of the third layer 230 would (re)sample the input signal only M times, and each of the N×M 3rd stage T/H blocks 302$_{x,y}$ of the third layer 230 would only resample once.

Figure 5:
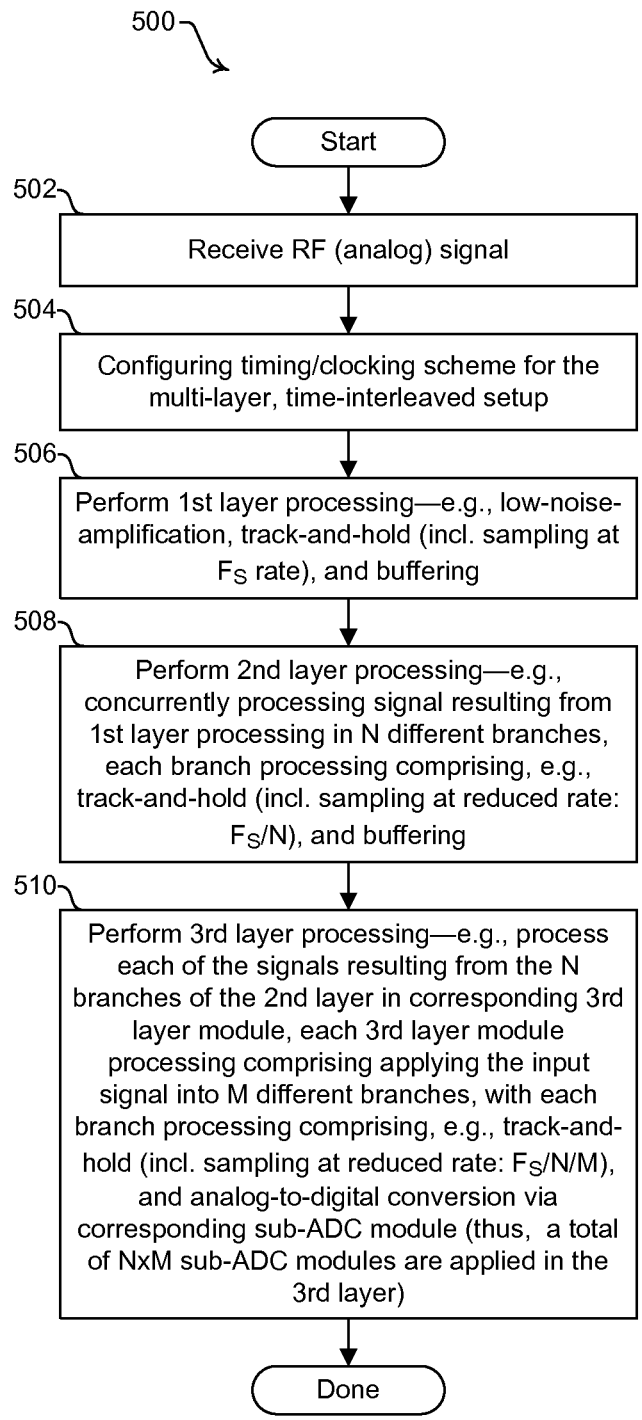
FIG. 5 is a flow chart that illustrates an exemplary multi-layer time-interleaved signal processing, such as ADC processing, in accordance with a representative embodiment of the invention.

FIG. 5 is a flow chart that illustrates an exemplary multi-layer time-interleaved signal processing, such as ADC processing, in accordance with an embodiment of the invention. Referring to FIG. 5, there is shown a flow chart 500 comprising a plurality of exemplary steps for multi-layer time-interleaved analog-to-digital conversion, such as in RF receiver 200 for example.

In step 502, a RF (analog) signal may be received. In step 504, a timing/clocking scheme for applying multi-layer, time-interleaved sampling and analog-to-digital conversion (ADC) may be configured. In this regard, configuring the clocking scheme may comprise generating based on a clocking signal of a first stage of sampling, clocking signals for subsequent stages of sampling applicable to the input signal, substantially as described with respect to FIGS. 2-4, for example. In step 506, first stage processing may be performed. This may comprise performing, at the received (input) RF signal, low-noise-amplification, sampling at FS rate (and tracking-and-holding output between sampling reads), and buffering the sampling (or tracked/held) output before transferring the output to the next (second) stage.

In step 508, second stage processing may be performed. This may comprise concurrently processing signal resulting from first stage processing via a plurality (e.g., N) different branches. In this regard, each second-stage branch processing may comprise, for example, sampling, at a reduced rate (e.g., at $F_S/N$), of output of the first stage processing (and tracking-and-holding output between sampling reads), and buffering the sampled (or tracked/held) output(s) before transferring the output(s) to the next (third) stage.

In step 510, third stage processing may be performed. This may comprise processing each of the signals resulting from the multiple branches (e.g., N) of the second stage in a corresponding third stage branch (e.g., one of 3rd layer modules 232₁-232$_N$ of the RF receiver 200). In this regard, processing through each third stage branch may comprise applying interleaving of the third stage branch input into multiple different sub-branches (e.g., M), with each sub-branch processing comprising, for example, sampling, at a reduced rate (e.g., at $F_S/N/M$), of a corresponding second stage processing branch (and tracking-and-holding output between sampling reads), followed by analog-to-digital conversion (ADC) via a corresponding sub-ADC module. In other words, by the end of the third stage of processing, a total of N×M sub-ADC modules are applied after 3 interleaved stages of sampling.

Various embodiments of the invention may comprise a method and system for multi-layer time-interleaved analog-to-digital convertor (ADC). [Claims w/ref-numbers].

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for improving linearity of an amplifier by means of IM3 cancelation.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed:

1. A method, comprising:
in an electronic device:
applying multi-level sampling to an input signal, using a plurality of sampling rates that comprises at least two different sampling rates; and
processing a plurality of outputs of said multi-level sampling, wherein the processing comprises:
sampling at a sampling rate that is different than each of the plurality of sampling rates used during said multi-level sampling; and
applying analog-to-digital conversion to each one of the plurality of outputs.

2. The method according to claim 1, comprising applying low-noise amplification to said input signal.

3. The method according to claim 1, comprising setting at least one of the plurality of sampling rates, used during said multi-level sampling, and/or said sampling rate used during said processing based on configuring of one or more clock signals used during said multi-level sampling and/or during said processing.

4. The method according to claim 3, comprising configuring at least one of the one or more clock signals based on reduction of frequency of a corresponding base clock signal.

5. The method according to claim 3, comprising configuring said one or more clock signals based on a base clock signal that is applied during one level of said multi-level sampling.

6. The method according to claim 1, comprising holding output signals corresponding to each level of said multi-level sampling and to said processing during non-read periods as determined based on an applicable sampling rate.

7. The method according to claim 6, comprising holding said output signals using grounding logic.

8. A system, comprising:
one or more circuits for use in an electronic device, the one or more circuits being operable to:
apply multi-level sampling to an input signal, using a plurality of sampling rates that comprises at least two different sampling rates; and
process a plurality of outputs of said multi-level sampling, wherein said processing comprises:
sampling at a sampling rate that is different than each of the plurality of sampling rates used during said multi-level sampling; and
applying analog-to-digital conversion to each one of the plurality of outputs.

9. The system according to claim 8, wherein said one or more circuits are operable to apply low-noise amplification to said input signal.

10. The system according to claim 8, wherein said one or more circuits are operable to set at least one of the plurality of sampling rates, used during said multi-level sampling, and/or said sampling rate used during said processing based on configuring of one or more clock signals used during said multi-level sampling and/or during said processing.

11. The system according to claim 10, wherein said one or more circuits are operable to configure at least one of the one or more clock signals based on reduction of frequency of a corresponding base clock signal.

12. The system according to claim 10, wherein said one or more circuits are operable to configure said one or more clock signals based on a base clock signal that is applied during one level of said multi-level sampling.

13. The system according to claim 8, wherein said one or more circuits are operable to hold output signals corresponding to each level of said multi-level sampling and to said processing during non-read periods as determined based on an applicable sampling rate.

14. The system according to claim 13, wherein said one or more circuits are operable to hold said output signals using grounding logic.

15. A system, comprising:
a signal receiver implemented on a single chip, the signal receiver comprising:
sampling circuitry that is operable to apply sampling to an input signal through a plurality of sampling levels, using a plurality of sampling rates that comprises at least three different sampling rates; and
an analog-to-digital conversion circuitry that is operable to apply analog-to-digital conversion to each one of a plurality of outputs of a last level of said plurality of sampling levels.

16. The system according to claim 15, wherein said signal receiver comprises a low-noise amplifier for amplifying said input signal.

17. The system according to claim 15, wherein said signal receiver comprises one or more buffering circuits for buffering intermediate outputs between consecutive levels of said plurality of sampling levels.

18. The system according to claim 15, wherein said signal receiver comprises one or more circuits that are operable to set at least one of the plurality of sampling rates based on configuring of one or more clock signals used in said plurality of sampling levels.

19. The system according to claim 18, wherein said signal receiver comprises one or more circuits that are operable to configure at least one of the one or more clock signals based on reduction of frequency of a corresponding base clock signal.

20. The system according to claim 15, wherein said signal receiver comprises one or more circuits that are operable to perform at least some of digital processing of one or more outputs of said analog-to-digital conversion circuitry, said digital processing comprising filtering and decoding to extract desired signals or data.

\* \* \* \* \*